United States Patent [19]

Weng et al.

[11] Patent Number: 5,005,007

[45] Date of Patent: Apr. 2, 1991

[54] ALARM DEVICE FOR MARINE TANK

[75] Inventors: Kuo-Lianq Weng; Kuo-Liang Weng, both of Taichung Hsien, Taiwan

[73] Assignee: Yu Li Enterprise Co. Ltd., Taiwan

[21] Appl. No.: 521,785

[22] Filed: May 10, 1990

[51] Int. Cl.$^5$ ............................................. G08B 21/00
[52] U.S. Cl. .................................. 340/650; 340/651; 324/133; 361/45
[58] Field of Search ............... 340/649, 650, 651, 660, 340/664; 324/133; 361/42, 45

[56] References Cited

U.S. PATENT DOCUMENTS 3,784,903  1/1974  Thomas ........................ 324/133 X
3,869,668  3/1975  Thompson ........................ 324/133

Primary Examiner—Joseph A. Orsino
Assistant Examiner—Jeffery A. Hofsass
Attorney, Agent, or Firm—Browdy and Neimark

[57] ABSTRACT

An alarm device adapted particularly for the indication of electrical leakage and mal-insulation of electrical appliances disposed in association with a marine tank for use in fish raising. An electrical leakage sensor unit is provided in the tank, to which are electrically plugged the illumination light, air pump, temperature controller, water filter member, germicidal light, so that an alarm signal led via an IC comparator and further to a sonic frequency vibrator for transformation and further to an signal amplifier and subsequently to a parallelly-connected buzzer and red-light indicator to simultaneously alarm the operator of the hazard of electrical leakage and mal-insulation.

1 Claim, 1 Drawing Sheet

ALARM DEVICE FOR MARINE TANK

FIELD OF THE INVENTION

The present invention is related to an alarm device which is particularly applied to a household marine tank with a number of electrical appliances plugged thereto whereby, electrical leakage and mal-insulation in operation can be effectively detected by a leakage sensor which can generate a signal transmitted to an IC comparator and to a sonic frequency vibrator and an amplifier which transmits the signal to a buzzer and a red indicator light.

It has become quite popular for people to locate household marine tanks in their homes for either decoration or for fun. Usually a lot of electric accessory appliances are attached to the marine tank, such as illumination light, air pump, water temperature controller, thermometer and filter etc. To the concerns of most people, electric leakage can cause serious electric shock and poor insulation condition also endangers the person feeding the fish or cleaning the marine tank as a result of the person with bare feet in contact with the ground, forming a short circuit loop.

A number of devices in the prior art have been developed to prevent people from being subject to electric shock; one of which enables the marine tank to be disconnected from the power supply. This type of operation will endanger the raised fish by not supplying enough air and heat in cold weather.

SUMMARY OF THE INVENTION

The object of the present invention is to provide an alarm device which is able to detect electrical leakage and mal-insulation condition to an operator by way of a serially connected buzzer and a red-light indicator which are actuated by an amplified signal generated by way of an IC comparator and a sonic frequency vibrator and an amplifier.

To better illustrate the operation mode, features and the structure of the alarm device of the present invention, a detailed description with a circuit diagram is given.

DETAILED DESCRIPTION OF THE PREFERRED EMBODIMENT

Figure 1:
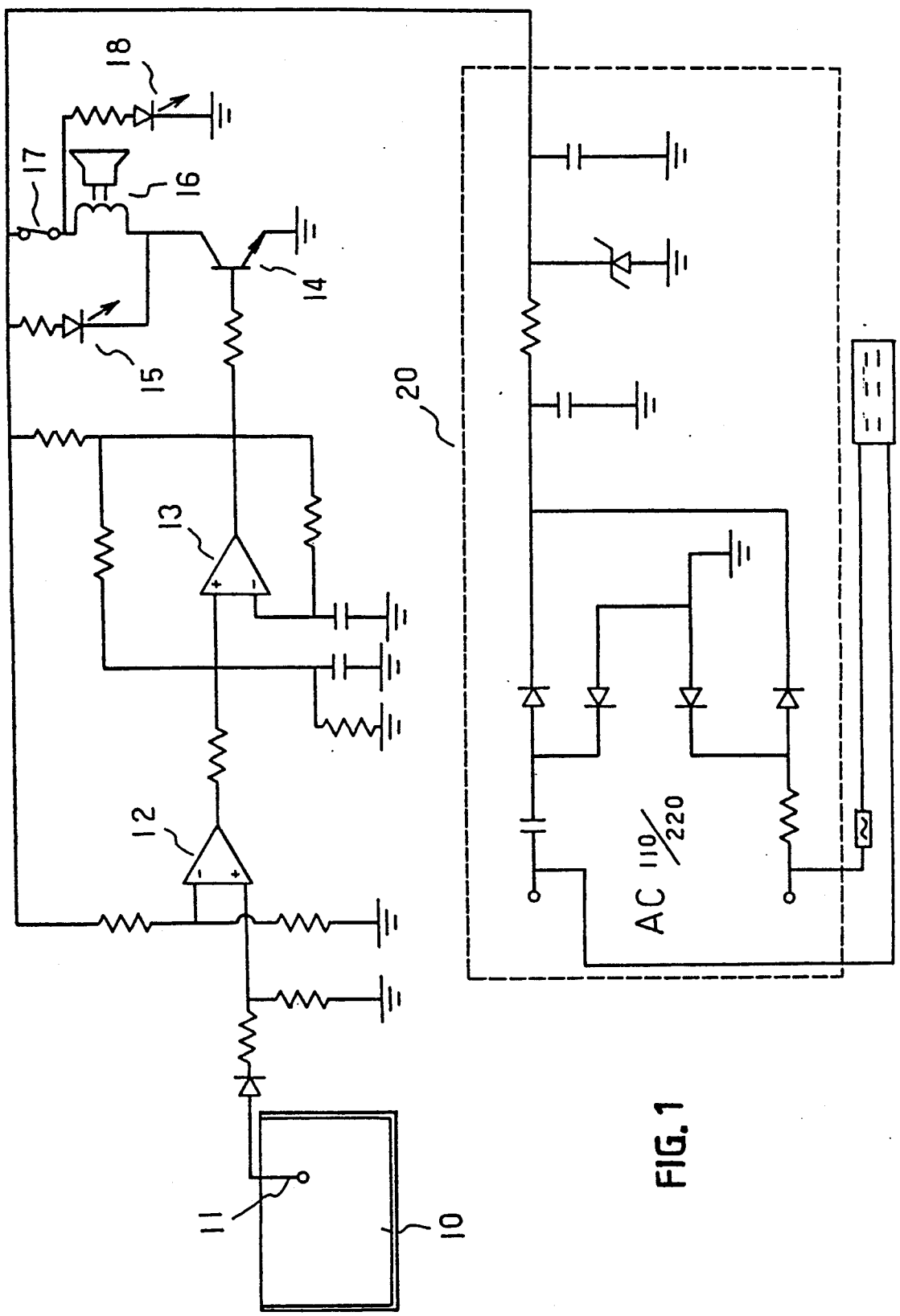
FIG. 1 is a circuit diagram of the present invention.

Referring to FIG. 1, the IC-type DC generating circuit of the present invention adopts capacitors and resistors for distribution of voltage, and further uses a rectifier to effect the transformation. It is different from the conventional type which employ an adapter to lower voltage and a rectifier to generate a direct current.

In the present invention, a sensor 11 is disposed in a marine tank 10 filled with water; and an illumination light, an air pump, water temperature controller and a filter are plugged to a receptacle at the AC end of the capacitor-exchange type power circuit 20, and a power supply stablizing circuit is connected to a power supply source for receiving power therefrom. The sensor 11 is serially coupled to a control element of a warning circuit associated with the capacitor-exchange type power supply circuit 20. The range of effective detection of electrical leakage is from 0.1 mA to 1 mA; and the resistor alarm indication is substantially 3.3 mOhm.

After the sensor 11 receives a signal indicating electric leakage in excess of 0.1-1 mA or that a human body is in direct contact with the ground with the insulation resistance less than 3.3 m ohms, the IC comparator 12 in serial connection to the sensor 11 will give the signal amplified by way of a serially connected operational amplifier 13 and a transistor amplifier 14; and the amplified signal is further transmitted to a red indicator light 15 to make the same operate and a buzzer 16 parallelly associated with the former to generate warning signals.

Moreover, the buzzer 16 can be serially connected to a manual switch 17 disposed next thereto and operable to control the buzzer to work or not; and a green light 18 disposed next and parallelly connected to the buzzer 16 is used to indicate whether power is transmitted to the alarm unit.

It becomes evident that when the marine tank is subject to an electric leakage or when the operator, with his hand in the marine tank and bare feet in touch with the ground, forms a closed loop, the alarm indicator light as well as the buzzer is actuated simultaneously to keep the operator alert, by way of the sensor and the associated circuits; or only the alarm indicator light is actuated to alarm the operator. By disconnecting one by one the plugs engaged with the receptacle of the power supply stablizing circuit, the operator is able to detect which one of the electrical appliances has electric leakage.

We claim:

1. An alarm device adapted for use in a household marine tank with accessory equipment so as to indicate to an operator an electric leakage or a poor insulation condition, comprising a sensor means in serial connection to an alarm circuit controlled by a capacitor exchange type power circuit which has a receptacle for receiving plugs from the accessory equipment such as an illumination light, air pump, water temperature controller, and filter means, and said power circuit being connected to a power source; wherein the range of detection of electric leakage is from 0.1 to 1 mA, and an indication of a poor insulation condition is given at a measurement of substantially 3.3 mΩ; whenever either electric leakage occurs inc said range, or a poor insulation condition is detected, a buzzer means and an indicator light will be actuated to keep the operator alert; by disconnecting one by one the plugs of said accessory equipment to see if the light and buzzer means cease actuation, the operator can locate a trouble spot with certainty.

* * * * *